(12) United States Patent
Bennett

(10) Patent No.: US 6,495,963 B1
(45) Date of Patent: Dec. 17, 2002

(54) INDUCTIVE COIL ASSEMBLY HAVING MULTIPLE COIL SEGMENTS FOR PLASMA PROCESSING APPARATUS

(75) Inventor: Paul George Bennett, Bristol (GB)

(73) Assignee: Trikon Holdings Limited, Gwent (GB)

( * ) Notice: Subject to any disclaimer, the term of this patent is extended or adjusted under 35 U.S.C. 154(b) by 0 days.

(21) Appl. No.: 09/673,081

(22) PCT Filed: Dec. 16, 1999

(86) PCT No.: PCT/GB99/04280
§ 371 (c)(1),
(2), (4) Date: Mar. 29, 2001

(87) PCT Pub. No.: WO00/36632
PCT Pub. Date: Jun. 22, 2000

(30) Foreign Application Priority Data

Dec. 17, 1998 (GB) .............................................. 9827778

(51) Int. Cl.⁷ ................................................. H01J 7/24
(52) U.S. Cl. .............................. 315/111.51; 315/111.21; 315/344; 118/723 I; 118/723 E
(58) Field of Search ....................... 315/111.21, 111.51, 315/111.71, 71, 231, 244, 248, 338, 344; 118/723 I, 723 E, 723 IR

(56) References Cited

U.S. PATENT DOCUMENTS

| | | | |
|---|---|---|---|
| 5,231,334 A | 7/1993 | Paranjpe | ................ 315/111.21 |
| 5,464,476 A | * 11/1995 | Gibb | .............................. 435/6 |
| 5,558,722 A | 9/1996 | Okumura et al. | ... 315/111.21 X |
| 5,589,737 A | * 12/1996 | Barnes et al. | ........... 219/121.43 |
| 5,726,413 A | * 3/1998 | Baenziger et al. | ........... 156/345 |
| 5,919,382 A | * 7/1999 | Qian et al. | ................. 118/723 I |
| 6,080,271 A | * 6/2000 | Fujii | .................... 118/723 AN |

FOREIGN PATENT DOCUMENTS

| | | |
|---|---|---|
| DE | 44 03 125 A1 | 8/1995 |
| EP | 0 651 427 A1 | 10/1993 |
| EP | 0 833 367 A2 | 4/1998 |
| JP | 08050998 | 2/1996 |
| WO | WO 96/18208 | 6/1996 |
| WO | WO 97/16946 | 5/1997 |

* cited by examiner

Primary Examiner—Haissa Philogene
(74) Attorney, Agent, or Firm—Volentine Francos, PLLC

(57) ABSTRACT

An inductive coil assembly for plasma processing apparatus includes a coil and an external screen. The coil is constituted by a plurality of coil portions each including an inductive segment. The assembly also includes respective connectors for connecting each portion in parallel with the others and to an RF source. The connectors are configured such that the current flowing in any part of the coil other than the segments is balanced by current flowing in an opposite sense in an adjacent part.

20 Claims, 10 Drawing Sheets

INDUCTIVE COIL ASSEMBLY HAVING MULTIPLE COIL SEGMENTS FOR PLASMA PROCESSING APPARATUS

BACKGROUND OF THE INVENTION

This invention relates to inductive coil assemblies for plasma processing apparatus.

As will be discussed in more detail below, there are currently many coil configurations for generating an inductively coupled plasma in a vacuum chamber for processing purposes. In at least most configurations, there can be capacitive coupling between the coil configuration and the plasma and the level of this capacitive coupling is related to the potential difference dropped across the coil configuration. Whilst such capacitive coupling can be beneficial in certain arrangements, there are also significant disadvantages and in particular it can lead to uncontrolled and undesired etching of surfaces within the chamber.

SUMMARY OF THE INVENTION

From one aspect the invention consisting an inductive coil assembly for plasma processing apparatus including a coil and an external screen characterised in that the coil is constituted by a plurality of coil portions and in that the assembly includes respective connecting means for connecting each portion in parallel with the others and to an RF source, the connecting means being formed such that the current flowing in any part of the coil other than a segment of a portion is balanced by current flowing in an opposite sense in an adjacent part.

Each coil assembly may be constituted by a plurality of adjacent segments which together define the inductive coupling portion of a cylindrical coil. That is to say each segment may be an arc. Conveniently the segments may be in the form of strips such that the coil is effectively in the form of a cylinder or frustocone. In any of these cases the connecting means may include a pair of rings and the portions may bridge between the rings.

In an alternative arrangement each segment may be constituted on a loop so that segments together form an array corresponding to a generally planar, domed or curved coil. The array may be constituted so that the segments are those parts of the portions which are unbalanced and thus produce net field. These will include those which lie on the periphery of the array.

The connecting means may include co-axial connections and/or rings. The latter may constitute a screen.

A respective capacitor may be connected across each portion so that the capacitors are connected in parallel. An advantage of the distribution of these capacitors is that it reduces current crowding by distributing current more evenly throughout the RF structure.

From another aspect the invention consists in an inductive coil assembly for plasma processing apparatus including a coil characterised in that the coil is constituted by a plurality of coil segments connected in series to form a loop, each coil segment being separated from its neighbour by a series connected capacitor, and in that the assembly includes means for supplying RF power to the loop.

The power supply means may be connected across one of the capacitors or, alternatively, it may include a coil for inducing RF power in the loop, in which case the mid-point of each segment is preferably earthed.

The segments may be equal in length and the capacitor values may be such that they resonate with the segments so that the reactive voltage in each segment is cancelled out.

Although the invention has been defined above it is to be understood it includes any inventive combination of the features set out above or in the following description.

BRIEF DESCRIPTION OF THE DRAWINGS

The invention may be performed in various ways and specific embodiments will now be described, by way of example, with reference to the accompanying drawings in which.

DETAILED DESCRIPTION OF THE PREFERRED EMBODIMENTS

Figure 1:
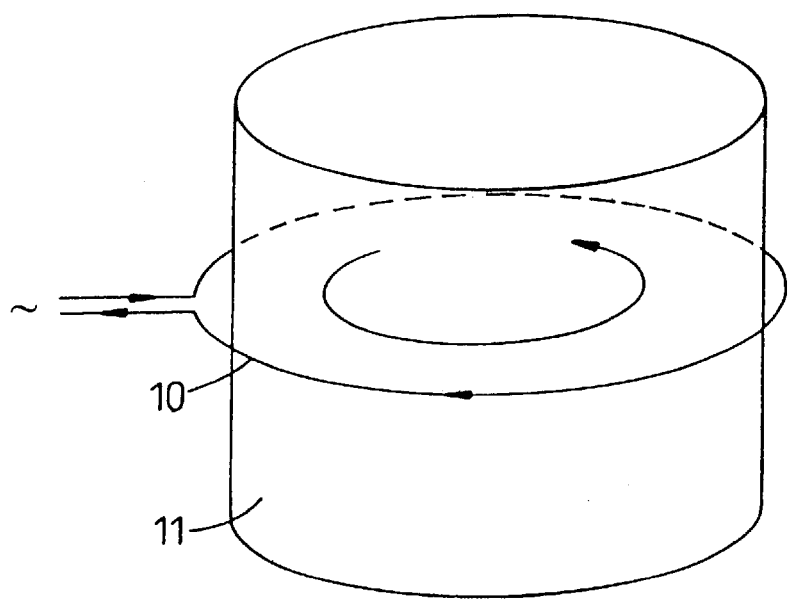
FIG. 1 is a schematic illustration of the simplest known arrangement for generating an inductive coupled plasma.

FIG. 1 illustrates the simplest arrangement for generating an inductively coupled plasma and comprises a single turn coil or loop 10 placed around a vacuum chamber which has a wall of a non-conductive material, such as glass or ceramic. Typically the chamber is evacuated and then filled, at low pressure (for example a few 10s mT) with an inert gas such as Argon. RF power is applied to the coil, which sets up an alternating magnetic field which penetrates the chamber. The magnetic field, in turn, will generate a circular electric field, which, if high enough, will ionise the gas and the conducting ring discharge will form just inside the chamber adjacent to the coil. The plasma then acts as the secondary of a transformer, in which the coil 10 is the primary.

The inductance and reflective resistance of the coil 10 will result in an RF voltage being developed around it This will therefore couple some energy to the plasma electrically due to the capacitance from the coil through the walls of the chamber. This can be of assistance in starting the discharge as the electrical field strength close to the end of the coil will be somewhat higher than the circumferential components. If electrical coupling is undesirable this can be screened using a Faraday cage, which is essentially transparent to the alternating magnetic field, but opaque to the electric field.

Figure 2:
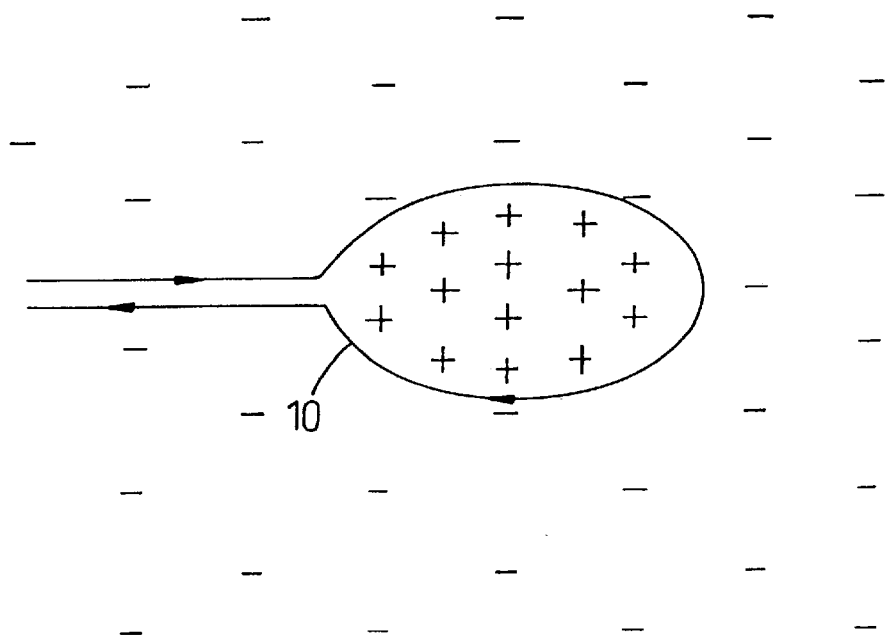
FIG. 2 is a schematic illustration of the magnetic field generated by the coil of FIG. 1 at the peak of an RF cycle.
Figure 3:
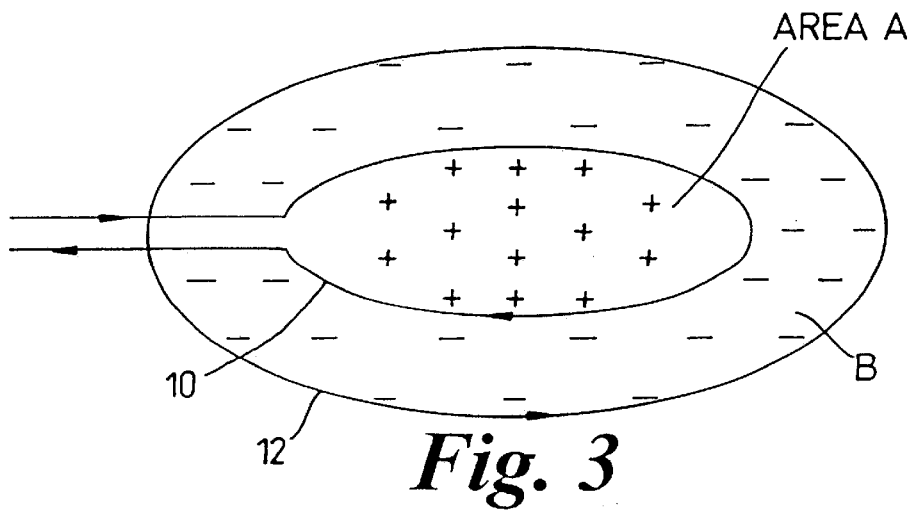
FIG. 3 is a further magnetic field diagram indicating the affect of the introduction of a screen.
Figure 4:
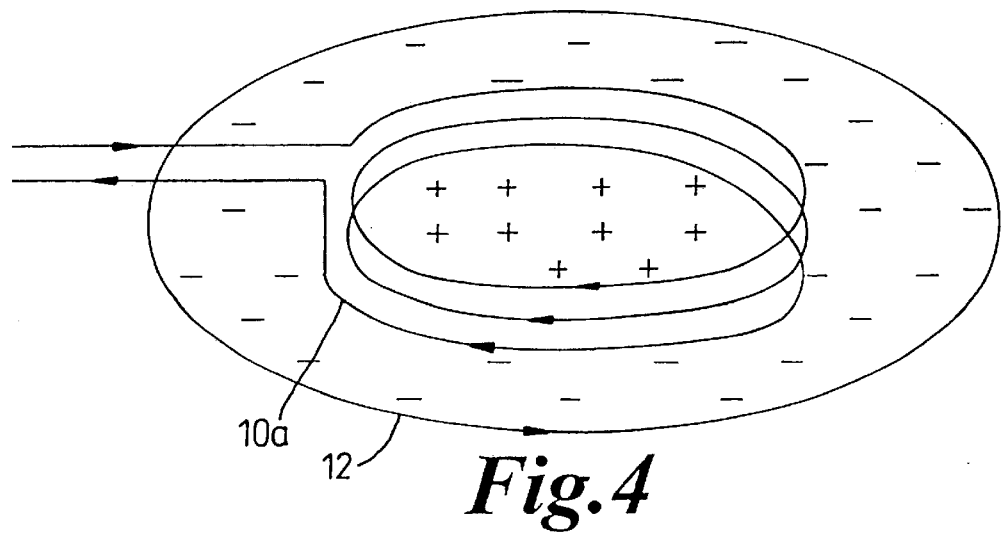
FIG. 4 is a magnetic field diagram for a multiple turn coil.
Figure 5:
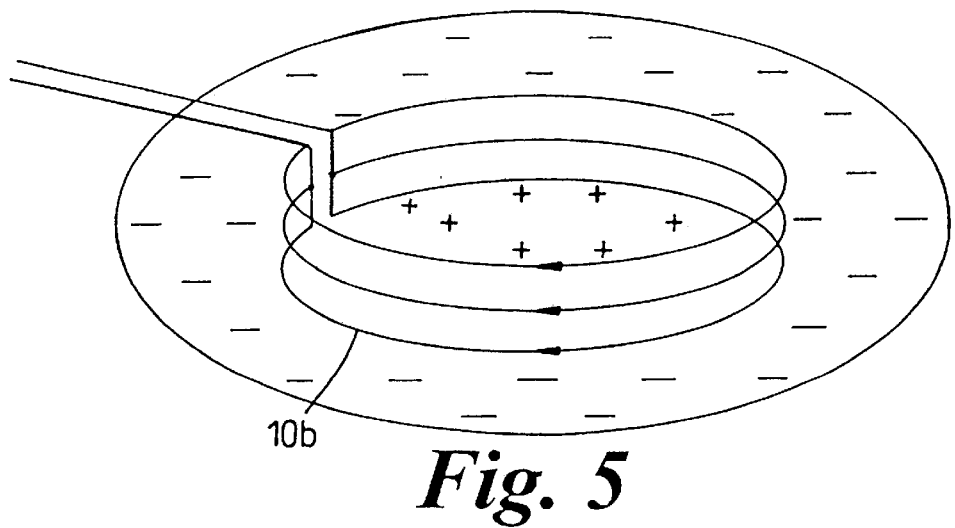
FIG. 5 is a similar diagram for an alternative coil.
Figure 6:
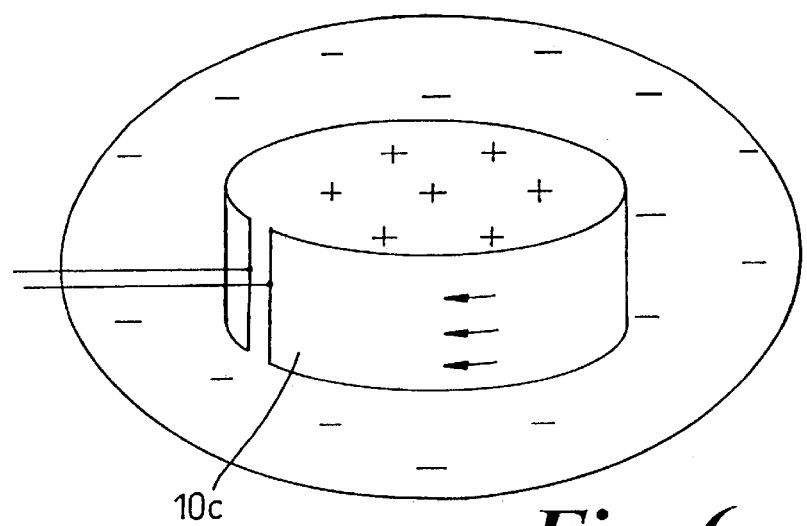
FIG. 6 is a diagram corresponding to that of FIG. 5 with the coil in the form of a strip.

In FIG. 2 the magnetic field of the coil 10 at the peak of the RF cycle is illustrated (ignoring the chamber). Inside the coil 10, the field is all in one direction, whilst outside it is in the opposite direction. If the coil is imagined in free space, then the field gradually dies away as it gets further away from the coil. However, if a screen 12 is introduced (see FIG. 3) a current will be induced in the screen in the opposite direction to that in the coil, cancelling any external field. In most practical arrangements the screen 12 is required to avoid RF interference and will often be an approximately seamless cylindrical structure, such as the overall enclosure. FIG. 4 illustrates how a multi-turn coil 10a can generate the same magnetic field pattern. FIG. 5 illustrates a parallel equivalent 10b, whilst FIG. 6 shows the coil in the form of a strip or split cylinder, in which the gaps between the turns in FIG. 5 have essentially been removed.

Figure 7:
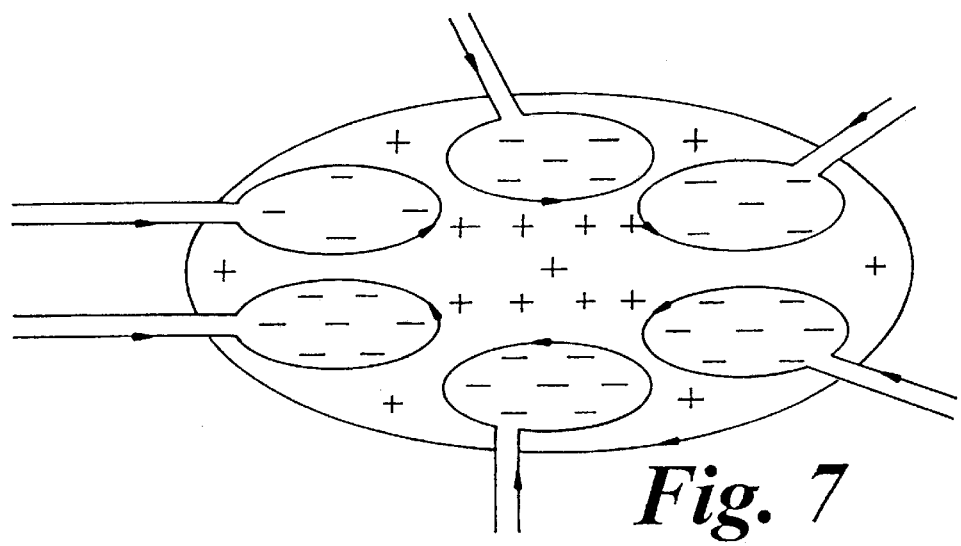
FIG. 7 is the diagram illustrating the use of segmented coils incorporating one aspect of the invention.
Figure 8:
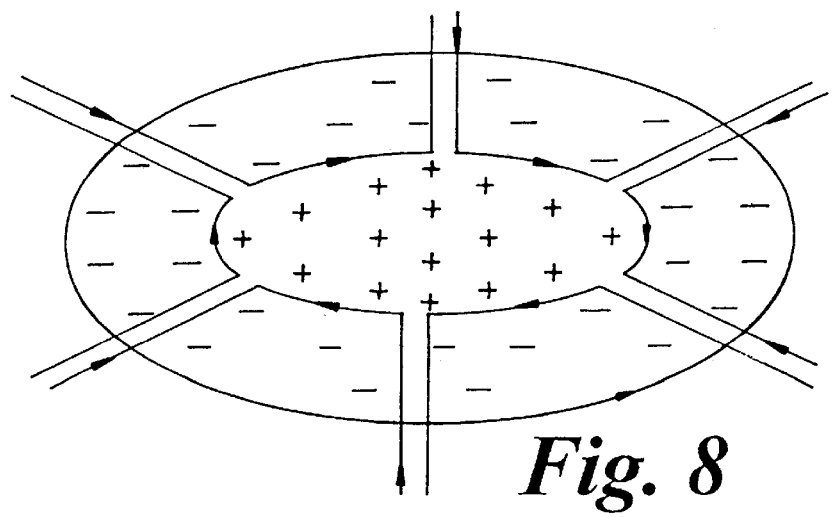
FIG. 8 illustrates how a development of FIG. 7 can be used so that a plurality of coil segments form a single coil assembly.

The voltage needed to be applied to the coil 10 depends on the frequency of the power supply and the coil size and is proportional to how many times the current loops around the area A. The voltage therefore increases with the number of loops or turns. All the magnetic field links through the outside area B and thus the current effectively loops around this also. The Applicants have realised that the area B can be broken up into fractions and therefore the voltage around each fraction will be less in proportion. Thus, as illustrated in FIG. 7, the area B may be filled with 6 coil portions 13, which combine to produce an almost corresponding pattern. The voltage required on any coil portion 13 will be approximately one sixth of the voltage required on the equivalent coil 10. However, with circular coil portions 13 the area B is not perfectly filled and leakage can occur in between the coil portions, reducing the field which couples through the centre. This problem can be overcome by configuring the coil portions as shown in FIG. 8 so that the coil portion 13 become segments or arcs 13a of the single coil 10. It will be noted that the leads 14 are arranged so that each input lead 14a lies immediately adjacent an output lead 14b, such that the adjacent pairs carry equal and opposite currents and are close to each other. This means that they do not generate any overall magnetic field and there is correspondingly no flux leakage. Adjacent pairs of leads 14a, 14b can be constituted by coaxial cable.

If, as is proposed by the Applicants, these coil portions 13 are connected in parallel, then the maximum voltage on each one will be the same and will be reduce compared to the simple single turn coil 10 in proportion to the number of coil portions present. Thus, for example, with six coil portions, the voltage will only be one sixth. Each coil portion 13 carries the same current as the single turn coil 10, so that the total current will be six times this. The impedance has therefore dropped by a factor of 36. In general for a coil made up of N portions, the voltage is reduced by N, the overall current is increased by N and the impedance is reduced as $N^2$.

Figure 9:
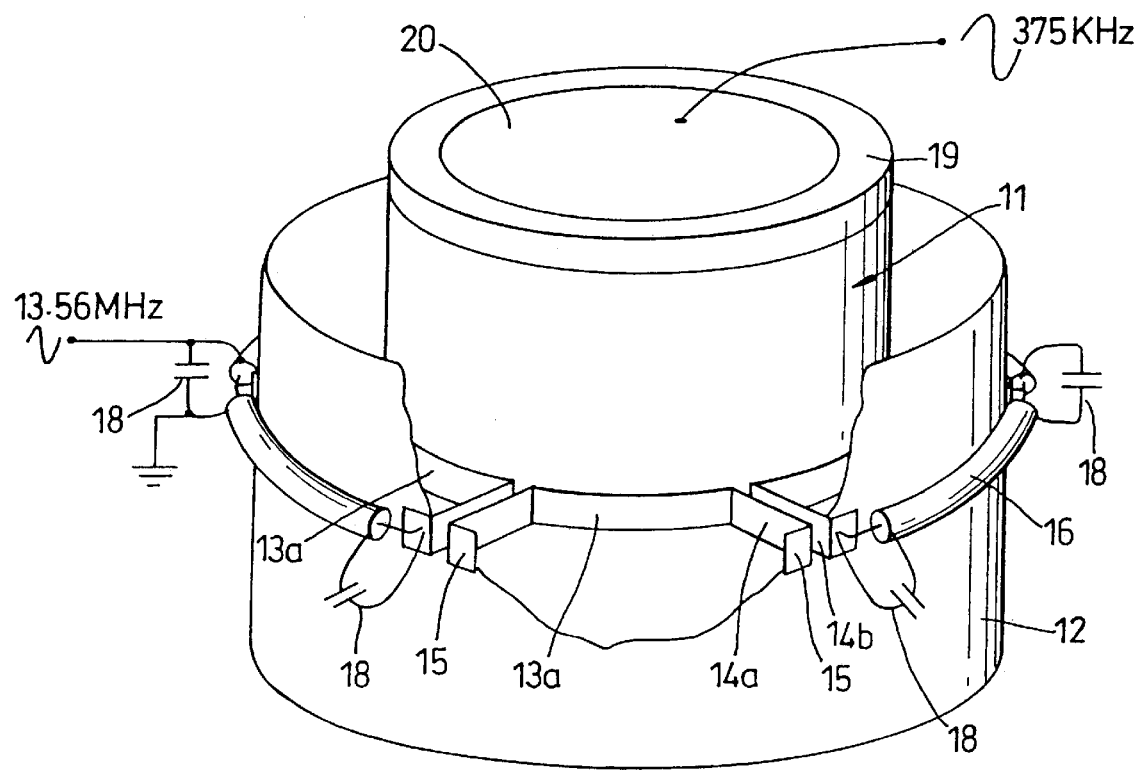
FIG. 9 is a schematic, partially cut away, perspective view of the apparatus of FIG. 8.

FIG. 9 illustrates more fully a practical configuration which can be utilised to provide the arrangement shown in FIG. 8.

Thus each segment 13a and its associated input and output leads 14a, 14b are formed from metal strip so that the segments 13a extend circumjacent the chamber 11 and the input and output leads of adjacent pairs of segments 13a extend radially outwards immediately adjacent to each other. The input and output leads extend through the screen 12 to present terminals 15 for connection to co-axial feed lines 16 that extend from power input 17. Respective capacitors 18 are connected across the segments 13a. A circuit demonstrating this configuration is set out in FIG. 10. The chamber 11 also has a lid 19 which incorporates an electrode 20 for forming an electric field within the chamber 11.

Figure 10:
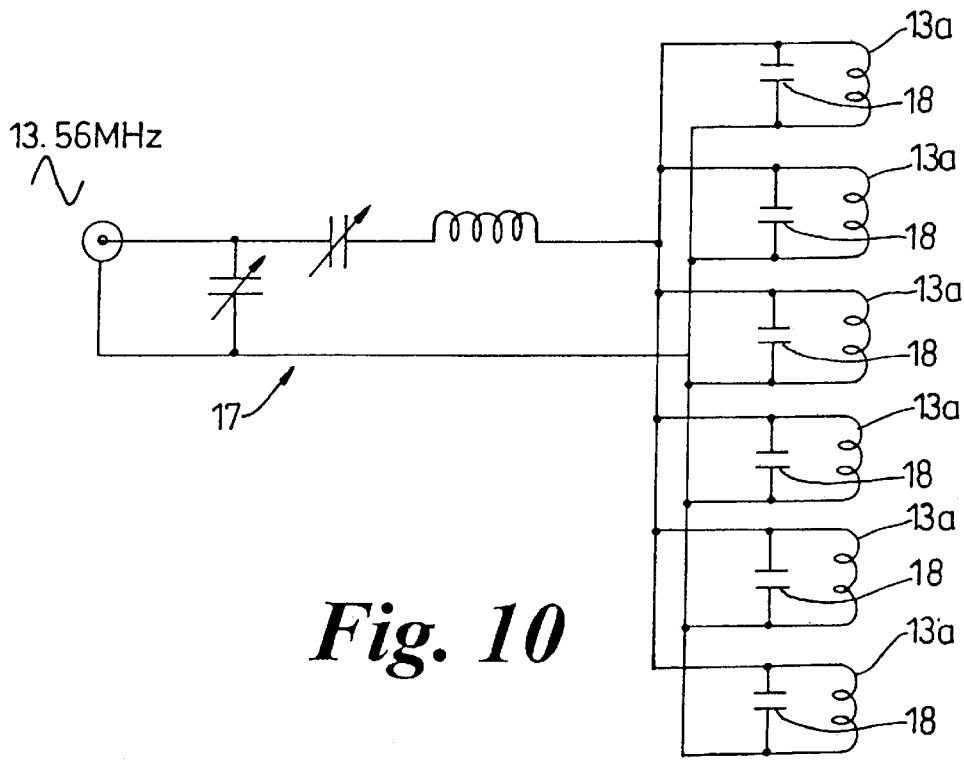
FIG. 10 is a circuit diagram illustrating how power is fed into the arrangement of FIG. 9.

Experiment The apparatus illustrated in FIGS. 9 and 10 was tested using a six segment coil. The chamber comprised a 190 mm borosilcate glass bell jar filled with Argon to approximately 20 mT. Initially a 200 mm diameter single turn coil of height 15 mm made of 1.2 mm thick aluminium was placed around this. An overall screen aluminium cylinder of 300 mm diameter was placed around the coil. 13.65 MHz RF was supplied via a matching unit, one end of which was grounded. A fixed 100 pF capacitor was placed across the coil to pass most of the circulating current. This and the L network were tuned to resonance.

A good match at 300 watts was obtained with a ring discharge struck inside the chamber. As the power was ramped up from zero a general faint glow at first appeared throughout the chamber due to electric field coupling. The ring discharge became more pronounced as the power was increased. Approximately 2,500V peak to peak was measured at the live end of the coil. The total tuning capacitance was approximately 300 pF.

The single turn was then replaced by the six segments 13a attached to the outer screen cylinder. These were connected in parallel via a ring main of co-axial cable 16. The three 1,000 pF capacitors and three 2,000 pF capacitors were distributed at the junctions of the ring main and coil segments. RF was applied by the same L network, some series inductance being required to obtain a good match. Total tuning capacitance approximated to 9,000 pF. No discharge could be initiated so an additional plate electrode was placed on the chamber perspex lid. This was connected to an additional source of RF at 375 kHz, which provided a very weak electrical discharge, but sufficient to strike the 13.65 MHz inductively coupled plasma. The upper electrode was then turned off. Once the plasma was struck, 300 W gave a visually similar ring discharge. Approximately 300 volts peak to peak was measured on the ring main.

Thus dividing the field generating area B up in this way enables the voltage to be reduced significantly as compared to the voltage requirements for a simple one turn coil and the arrangement of the input and output leads ensures there is no significant flux leakage. The operating voltages can thus to a great extent be chosen independent of the frequency required and the chamber size. The ability to reduce the voltage supplied, provides the apparatus designer with the ability to reduce or remove the unwanted electrical coupling, which arises from current designs.

Figure 11:
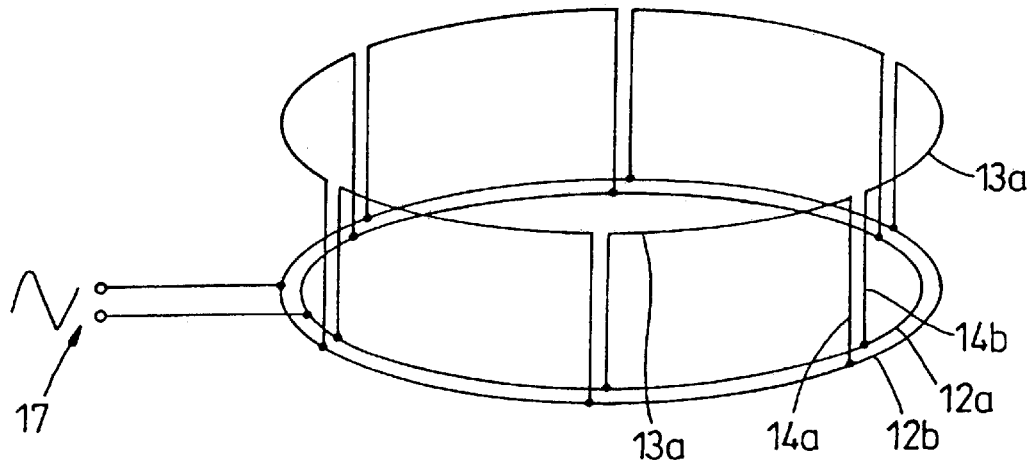
FIG. 11 shows an alternative wiring arrangement for the coil segments.
Figure 12:
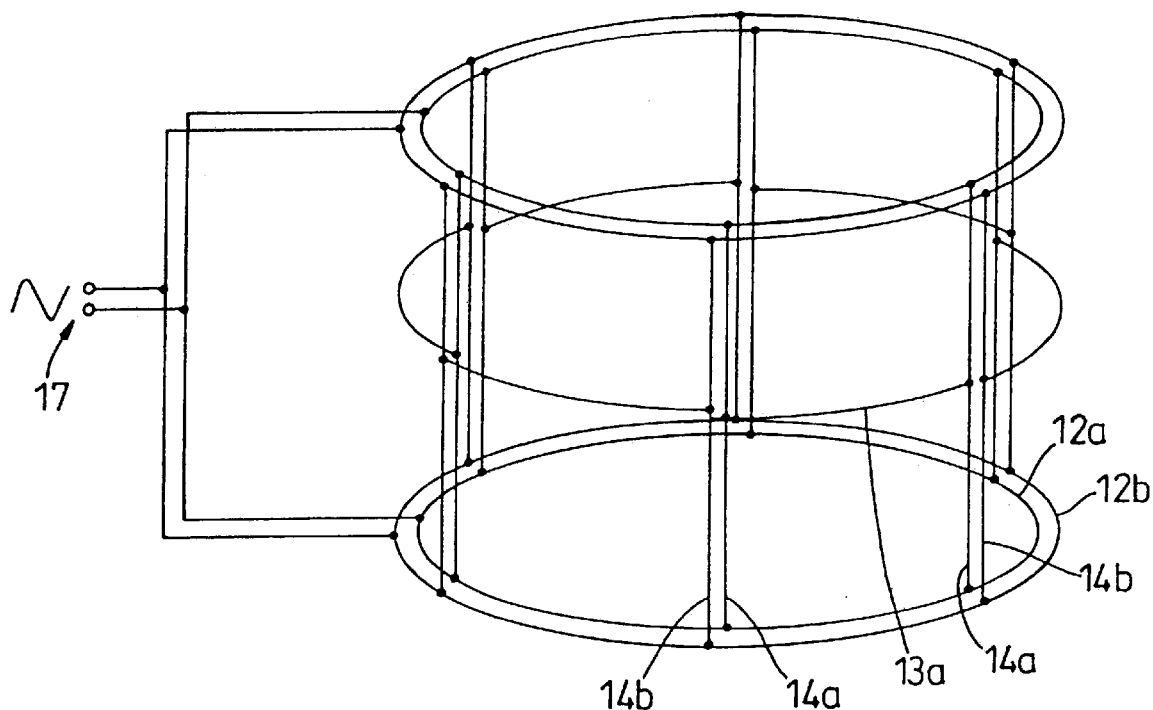
FIG. 12 shows how the wiring arrangement of FIG. 11 can be doubled up using a mirror image.

FIG. 11 illustrates a similar configuration, but wherein the input and output leads 14a, 14b have been rotated through 90°, whilst FIG. 12 shows how two sets in mirror image could be employed.

It should be noted that where the connecting means includes a ring or rings (e.g. 12a, 12b), then the ring or rings will function as a screen as a sufficient and opposite current will flow in the ring or rings as compared with the coil portions.

Figure 13:
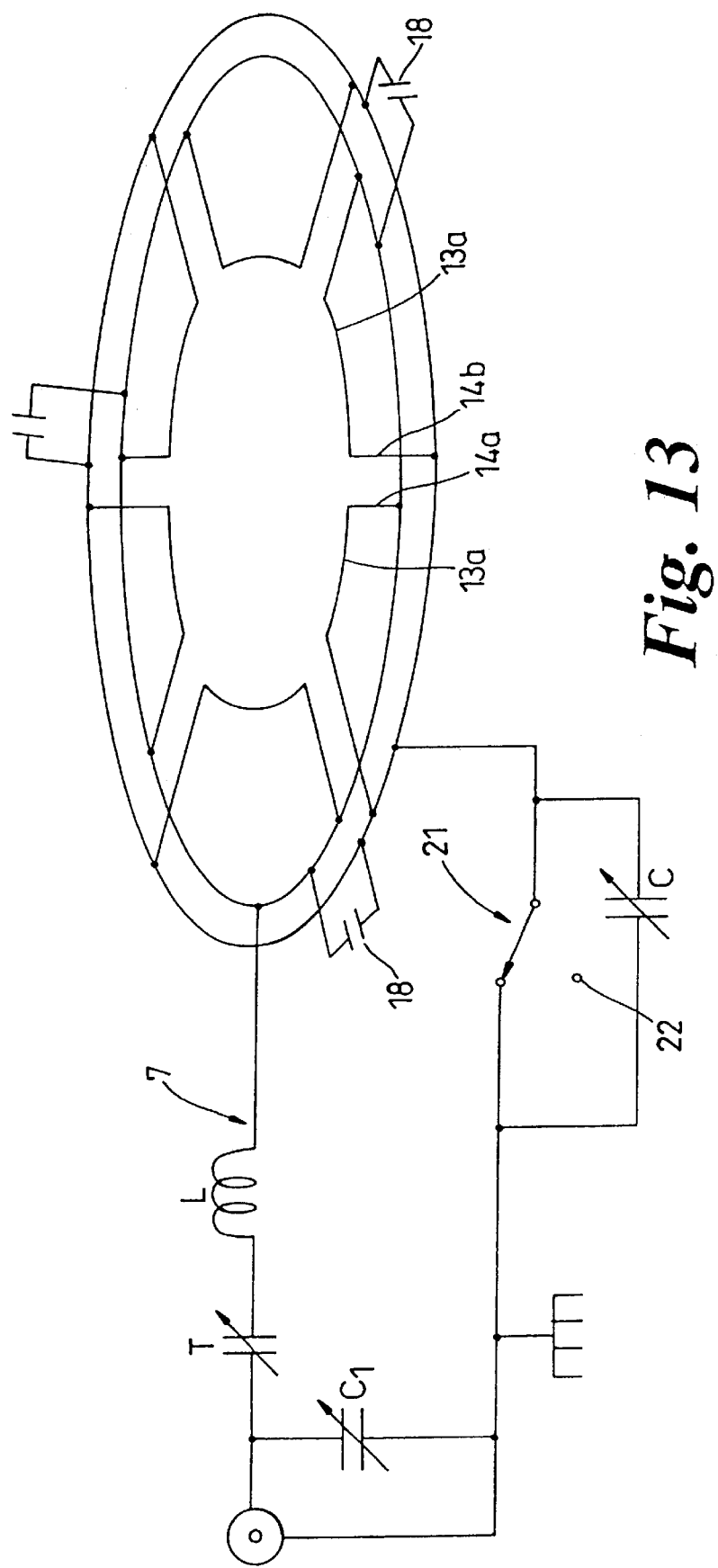
FIG. 13 illustrates an arrangement in which a high voltage (capacitive) mode may be available for striking the plasma and a lower voltage mode used for sustaining the plasma.

FIG. 13 is essentially similar to the arrangement in FIG. 9, but an additional switch 21 is included so that the circuit can be switched between the illustrated position in which the segments 13a are connected in parallel and a second position 22 in which variable capacitor C allows tuning of a common mode voltage into the segments 13a. Thus tuning capacitor C in conjunction with tuning capacitor C1 and conductor L may be adjusted to create a large voltage drop across C, thus causing a high voltage to appear on segments 13a. In the second position a high voltage can be applied to strike the plasma and once the plasma is struck, then the switch is moved into the illustrated position for "low voltage" operation. Additionally or alternatively the high common mode operation may also be used for sputtering the segments 13a or adjacent chamber parts.

Figure 14:
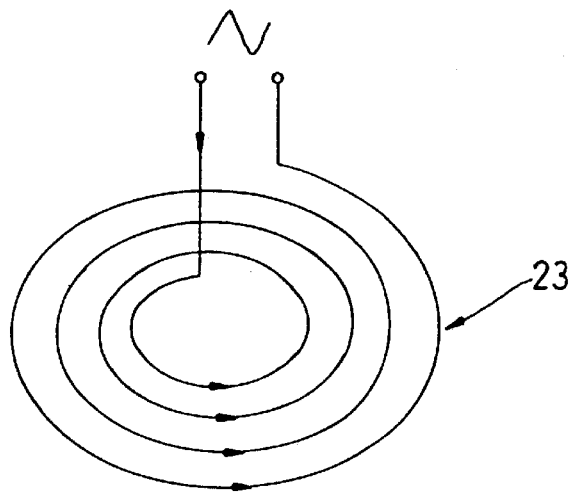
FIG. 14 illustrates a typical known spiral coil, which can be placed adjacent to a dielectric window as the diagrammatically illustrated in FIG. 15.
Figure 15:
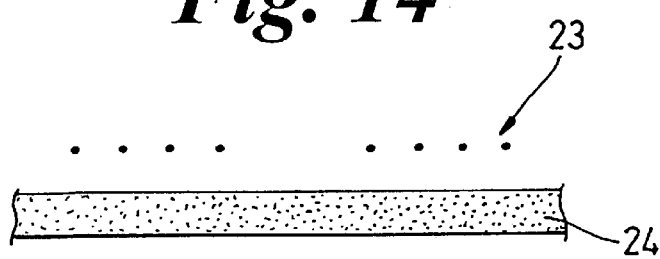

The configurations described above all relate to coil assemblies which correspond to cylindrical coils. However, a large number of plasma processing apparatuses use "flat" coils that sit against dielectric windows or curved or dome like coils that sit over dome shaped windows. A typical example of a flat coil 23 is illustrated in FIGS. 14 and 15. The dielectric window is indicated at 24.

Figure 16:
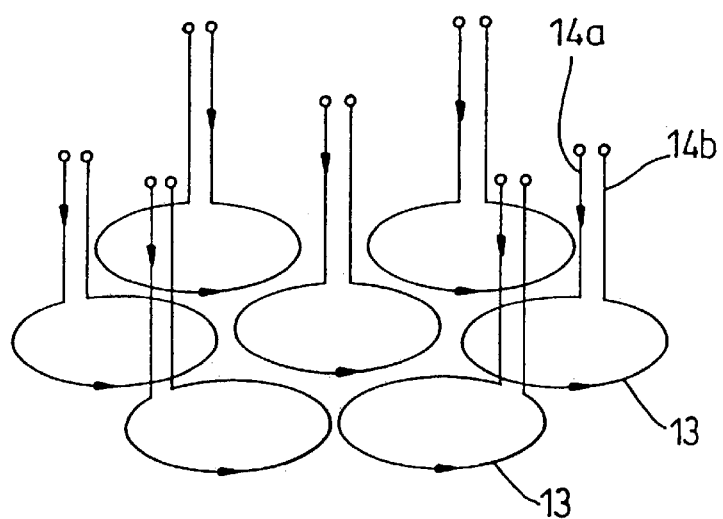
FIG. 16 is a schematic illustration of the equivalent arrangement according to the invention.
Figure 17:
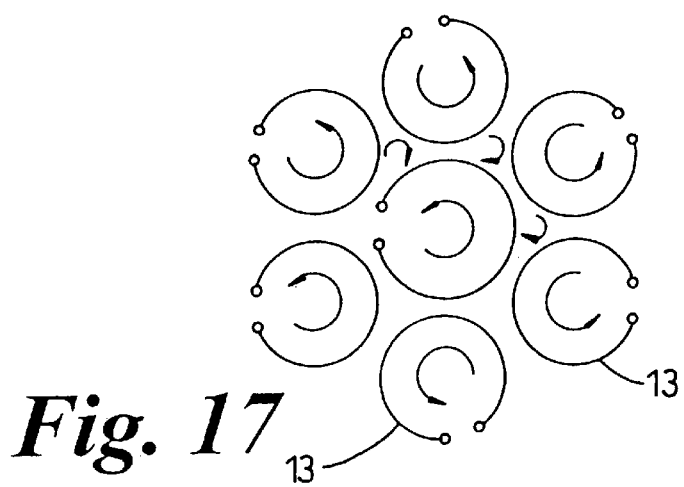
FIG. 17 is an end view of the FIG. 16 arrangement.

FIGS. 16 and 17 illustrate the Applicants' corresponding coil assembly and the theoretical basis for this is essentially exactly the same as set out in connection with FIG. 7 above. Once again the circular portions 13 do not completely fill the area B and there is some flux leakage. The arrangement shown in FIG. 18 overcomes this. Here the coil portions are essentially hexagonal. It will be noted that in addition to the leads being arranged in pairs that take oppositely flowing current, some facets of coil portions lie adjacent each other. In this arrangement the outer coil portions include segments including unbalanced facets 13a at the periphery of the structure. This will allow a net field to be produced at the periphery. If a central coil portion(s) 13b is included, and is connected in the same phase direction and in parallel with the outer coil portions, then a greater current is present on the inner coil portion e.g.

v=voltage
x=reactance of a facet of a coil portion
$I_o$=current in the outer coil portion
$I_i$=current in the inner coil portion
   i. $V=3\times I_o - x(I_i - I_o)$ outer coil portions
   ii. $V=6\times(I_i - I_o)$ inner coil portion
As the voltage on both inner and outer is the same:
$6(I_i - I_o) = 3I_o - I_i + I_o$
$7I_i = 10 I_o$
$I_i = 1.43 I_o$ The current flowing in the inner coil portion 13b will thus be greater than the adjacent outer coil portion facet 13c. As a result a reversed voltage drop will appear on the adjacent outer coil portion facet. Thus the outer coil portion facet 13c adjacent an inner coil or coils portion 13b is also unbalanced and produces net field coupling into the plasma and hence effectively forms part of the coil.

Without affecting the generality of the invention such flat coil arrangements may have any number of inner and outer coil portions including arrangements with no inner coil portions.

Figure 18:
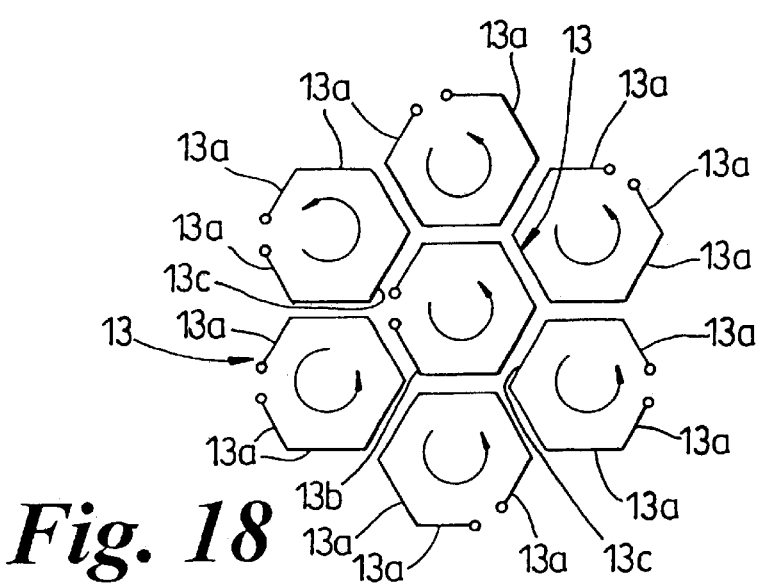
FIG. 18 corresponds to FIG. 17 but on this occasion the coil portions are hexagonal.
Figure 19:
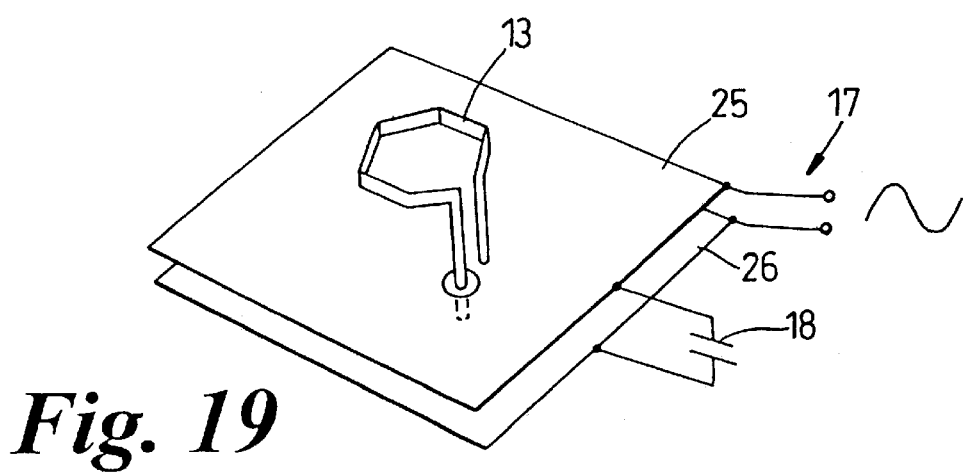
FIG. 19 illustrates the connection to the power supply of a single hexagonal coil portion FIG. 18.
Figure 20:
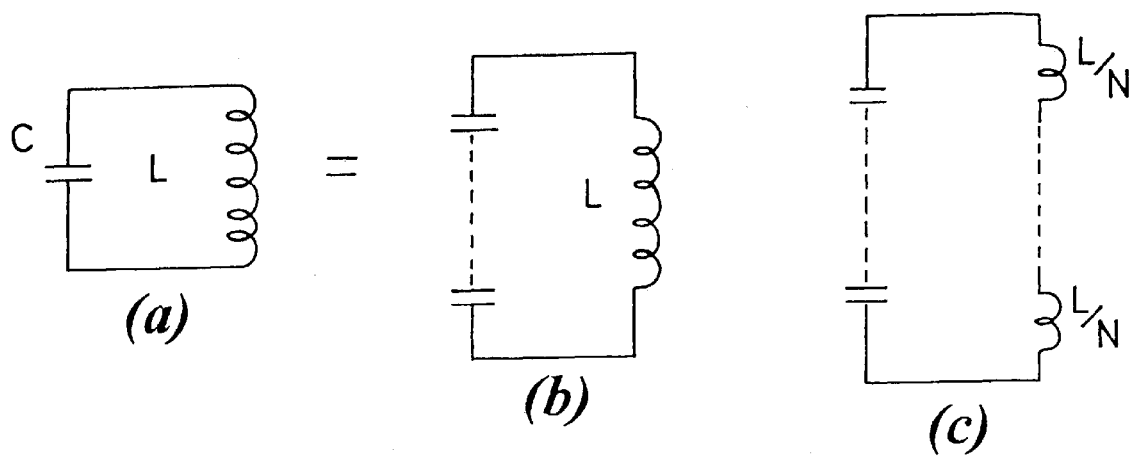
FIGS. 20a–c indicate how a LC circuit is the equivalent of a circuit having a polarity of series capacitors and a polarity of series coil portions.

FIG. 19 illustrates how any one of the coil portions 13 of FIG. 18 can be connected to the power supply 17. It will be seen that a pair of plates 25, 26 are used to receive the respective input and output connections and the capacitors 18 in power supply 17 are connected across these plates.

FIGS. 20 to 25 relate to a different approach of the problem of voltage reduction. In a single coil arrangement, (see FIG. 20(a)) there is typically, essentially, a capacitor C connected across an inductor L. As shown in FIG. 20b the capacitor C can be made up of a number of capacitors connected in series and the inductance may be treated as a number of inductance portions in series (see FIG. 20c.

Figure 21:
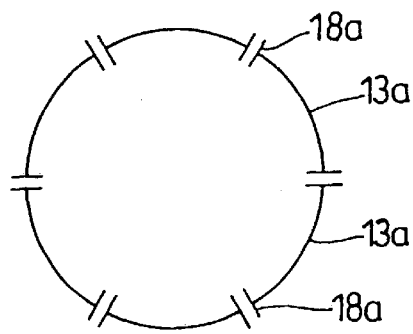
FIG. 21 illustrates how such a circuit could be configured by arcuate segments interconnected by capacitors to form a circular loop.
Figure 22:
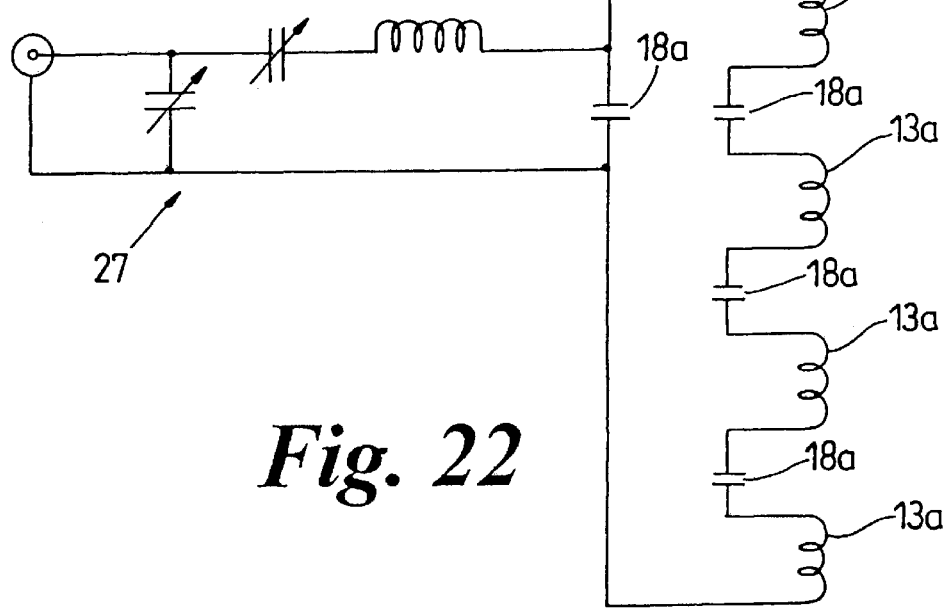
FIG. 22 illustrates how such an arrangement can be fed by a matching circuit connected across one of the capacitors.
Figure 23:
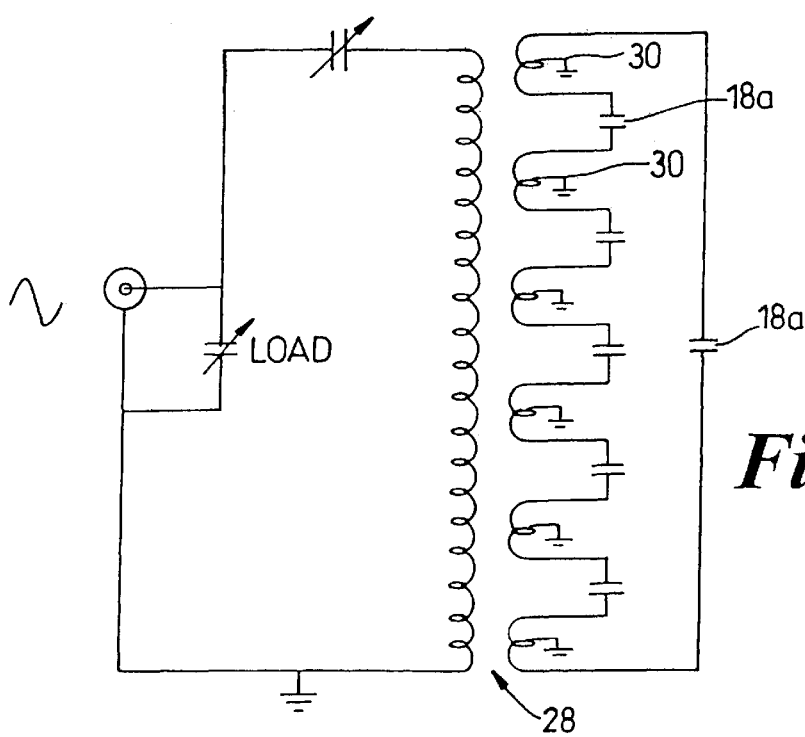
FIGS. 23 and 24 illustrated as a circuit diagram and schematically respectively an equivalent immersed coil arrangement fed inductively.
Figure 24:
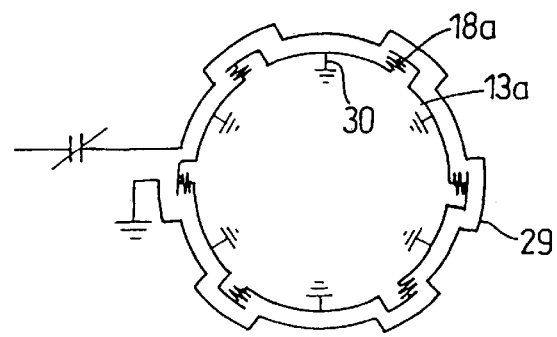
Figure 25:
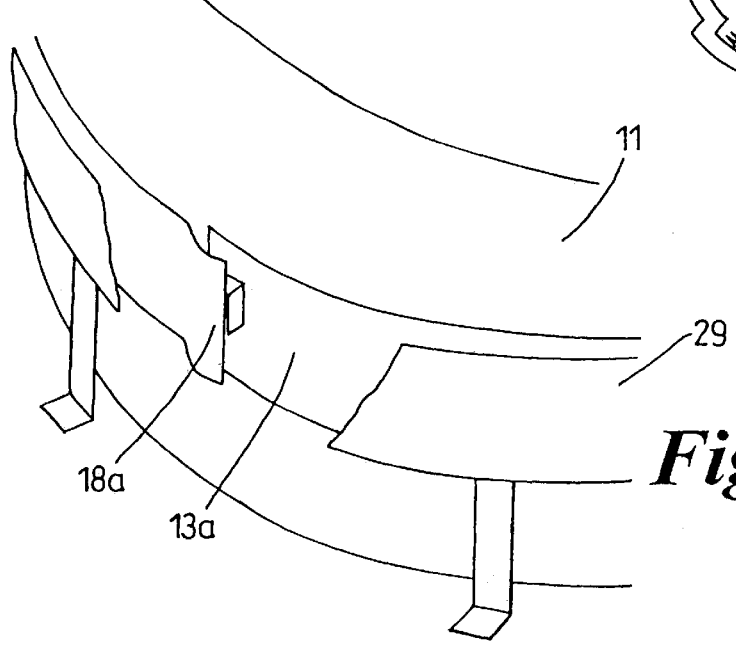
FIG. 25 is a detailed scrap view showing a practical embodiment of FIG. 24.

The Applicants have realised that it is possible to locate the individual capacitors C between each coil portion and hence form a circuit as shown in FIG. 21. It will now been seen that, once again, there are a number of individual segments 13a making up a single loop coil. Such an arrangement can be fed either, as illustrated in FIG. 22, by using a power supply and matching unit 27 connected across one of the capacitors or, as illustrated in FIGS. 23 to 24, by making the coil segments 13 the secondary coil of a transformer 28. It has been determined that, whilst any point of the coil segments 13a may be earthed, it has been particularly advantageous if the mid points 30 of each coil segment 13a is earthed and the primary can in fact be constituted by a single strip loop 29 as shown in FIGS. 24 and 25.

When the mid-points are earthed, the inner coil could be viewed as a resonating Faraday cage and hence it will screen the electric field from the coupling coil. The use of a coupling coil 29 is particularly advantageous when the coil 10 for inductively coupling the plasma is to be immersed within the chamber 11.

What is claimed is:

1. An inductive coil assembly for plasma processing apparatus including a coil and an external screen, wherein the coil is constituted by a plurality of coil portions each including an inductive segment and wherein the assembly includes respective connecting means for connecting each portion in parallel with the others and to an RF source, the connecting means being formed such that the current flowing in any part of the coil other than the segments is balanced by current flowing in an opposite sense in an adjacent part.

2. An assembly as claimed in claim 1, wherein each portion constitutes one of a plurality of adjacent segments which together define the inductive coupling portion of a generally cylindrical or frusto conical coil.

3. An assembly as claimed in claim 2, wherein each segment is in the form of a strip such that the coil is effectively in the form of a cylinder or frustocone.

4. An assembly as claimed in claim 2, wherein the connecting means includes a pair of rings and the segments are connected between the rings.

5. An assembly as claimed in claim 1, wherein each portion is constituted on a loop so that at least segments of the portions together form an array corresponding to a generally planar or curved coil.

6. An assembly as claimed in claim 5, wherein the segments include those parts of the portions which lie on the periphery of the array.

7. An assembly as claimed in claim 6 wherein the array includes a central coil which creates unbalanced current in adjacent segments.

8. An assembly as claimed in claim 2 wherein the connecting means include by coaxial connections.

9. An assembly as claimed in claim 2 further comprising a capacitor connected across each coil portions so that capacitors are connected in parallel to constitute a tuning capacitor for the assembly. the capacitors.

10. An assembly as claimed in claim 1, wherein the coil is circumjacent a plasma processing chamber.

11. An assembly as claimed in claim 2, wherein the coil is circumjacent a plasma processing chamber.

12. An assembly as claimed in claim 5, wherein the coil is circumjacent a plasma processing chamber.

13. An inductive coil assembly for plasma processing apparatus including a primary coil and a secondary coil, wherein the secondary coil is constituted by a plurality of coil segments connected in series to form a loop, each coil segment being separated from its neighbour by a series connected capacitor and each coil segment being inductively coupled to the primary coil, and wherein the assembly includes means for supplying RF power to the primary coil.

14. An assembly as claimed in claim 13 wherein the midpoint of each segment is earthed.

15. A coil assembly as claimed in claim 1 wherein the power supply means include a primary coil for inducing RF power in the loop.

16. An assembly as claimed in claim 13, wherein the segments are equal in length and the capacitors' values are such that the capacitors resonate with the segments so that the reactive voltage in each segment is cancelled out.

17. An assembly as claimed in claim 13, wherein each segment is earthed.

18. An assembly as claimed in claim 13, wherein the coil is circumjacent a plasma processing chamber.

19. An inductive coil assembly for plasma processing apparatus including a coil characterized wherein the coil is constituted by a plurality of coil segments connected in series to form a loop, each coil segment being separated from its neighbour by a series connected capacitor, wherein the assembly includes means for supplying RF power to the loop, and wherein the power supply means are connected across one of the capacitors.

20. An assembly as claimed in claim 19, wherein the coil is circumjacent a plasma processing chamber.

* * * * *